United States Patent [19]
Nill et al.

[11] Patent Number: 5,537,444
[45] Date of Patent: Jul. 16, 1996

[54] EXTENDED LIST OUTPUT AND SOFT SYMBOL OUTPUT VITERBI ALGORITHMS

[75] Inventors: Christiane G. Nill, Rome, Italy; Carl-Erik W. Sundberg, Chatham, N.J.

[73] Assignee: AT&T Corp., Murray Hill, N.J.

[21] Appl. No.: 4,360

[22] Filed: Jan. 14, 1993

[51] Int. Cl.⁶ .................................................. H04L 27/06
[52] U.S. Cl. ............................ 375/341; 375/262; 371/43
[58] Field of Search ............................... 375/39, 38, 80, 375/94, 341, 265, 262; 371/43, 37.1

[56] References Cited

U.S. PATENT DOCUMENTS

| | | | |
|---|---|---|---|
| 4,660,214 | 4/1987 | Pahlavan et al. | 375/39 |
| 5,181,209 | 1/1993 | Hagenauer et al. | |
| 5,208,816 | 5/1993 | Seshardi et al. | 371/43 |
| 5,263,033 | 11/1993 | Seshardi | 375/39 |

FOREIGN PATENT DOCUMENTS

| | | | |
|---|---|---|---|
| 0391354 | 10/1990 | European Pat. Off. | H04L 1/00 |
| 0413505A1 | 2/1991 | European Pat. Off. | H04L 1/00 |

OTHER PUBLICATIONS

European Search Report.

U.S. application Ser. No. 07/850,239 filed on Mar. 11, 1992 to Seshadri et al.

N. Seshadri et al., "Generalized Viterbi Algorithms for Error Detection with Convolutional Codes," *IEEE Global Telecommunications Conference & Exhibition*, Dallas Texas, 1534–1538 (Nov. 27–30, 1989).

J. Hagenauer et al., "A Viterbi Algorithm with Soft-Decision Outputs and its Applications," *IEEE Global Telecommunications Conference & Exhibition*, Dallas, Texas, 1680–1686 (Nov. 27–30, 1989).

T. Hashimoto, "A List-Type Reduced-Constraint Generalization of the Viterbi Algorithm," *IEEE Transactions on Information Theory*, vol. 33, No. 6 866–876 (Nov. 1987).

T. Schaub et al., "An Erasure Declaring Viterbi Decoder and its Applications to Concatenated Coding Systems," *IEEE International Conference on Communications* '86, Toronto, Canada, 1612–1616 (Jun. 22–25 1986).

"Estimating Unreliable Packets in Subband Coded Speech," by W. C. Wong, N. Seshadri & C.–E. W. Sundberg, Globecom '90, San Diego, CA 906.6.1–906.6.5 (Dec. 1990).

"Generalized Viterbi Algorithms for Error Detection with Convolutional Codes." by N. Seshadri and C. E. W. Sundberg, Globecom '89, Dallas, Texas, 1–5 (Nov. 1989).

"Decoding of Convolutional Code into List," by Zyablov, V.; Potapov, V.; and Sidorenko, V., Journal Proc. of Int'l. Workshop Voneshta Voda (Bulgaria), 161–168 (Jun. 1992).

"Concatenated Viterbi–Decoding," J. Hagenauer and P. Hoeher, Fourth Joint Swedish–Soviet Int. Workshop on Inf. Theory, Gotland, Sweden, Studentlitteratur, Lund, 29–33 (Aug. 1989).

"Error Bounds for Convolutional Codes and an Asymptotically Optimum Decoding Algorithm," by A. J. Viterbi, IEEE Transactions on Information Theory, vol. IT-13, No. 2, 260–269 (Apr. 1967).

"A List–Type Reduced–Constraint Generalization of the Viterbi Algorithm," by T. Hashimoto, IEEE Transactions on Information Theory, vol. IT-33, No. 6, 866–867 (Nov. 1987).

(List continued on next page.)

*Primary Examiner*—Stephen Chin
*Assistant Examiner*—T. Ghebretinsae
*Attorney, Agent, or Firm*—Katharyn E. Olson

[57] ABSTRACT

A family of extended Generalized Viterbi Algorithm (GVA) and Soft Output Viterbi Algorithm (SOVA) decoders is disclosed. In one embodiment structural aspects of a SOVA are used to develop a new implementation for a serial GVA. Another aspect of the invention provides a low complexity SOVA that generates a reliability measure for decoded information using a list output of the GVA. In a further aspect, reliability information from a SOVA is used to develop a low complexity GVA.

25 Claims, 6 Drawing Sheets

OTHER PUBLICATIONS

"Channel Coding with Multilevel/Phase Signals," by G. Ungerboeck, IEEE Transactions on Information Theory, vol. IT-28, No. 1, 55-67 (Jan. 1982).

"Maximum-Likelihood Sequence Estimation of Digital Sequences in the Presence of Intersymbol Interference," by G. D. Forney, Jr., IEEE Transactions on Information Theory, vol. IT-18, No. 3, 363-377 (May 1972).

"The Viterbi Algorithm," by G. D. Forney, Jr., Proceedings of the IEEE, vol. 61, No. 3, 268-278 (Mar. 1973).

"Digital Phase Modulation" by J. B. Anderson, T. Aulin, and C-E. Sundberg, 1968 Plenum Press, New York.

"Error Control Coding: Fundamentals and Applications," by S. Lin and D. J. Costello, Jr., 3-5 and 329, Prentice-Hall (1983).

"HF Communications: A Systems Approach," by N. M. Maslin, 198-199, Plenum Press, New York (1987).

"Error-Correction Coding for Digital Communications," by G. C. Clark, Jr., 26-34 and 227-235, Plenum Press New York (1981).

"Error-Control Techniques for Digital Communication," by A. M. Michelson and A. H. Levesque, 3-13 and 303-305, John Wiley & Sons (1985).

EXTENDED LIST OUTPUT AND SOFT SYMBOL OUTPUT VITERBI ALGORITHMS

TECHNICAL FIELD

This invention relates to the coding and decoding of digital information transmitted over a communication channel. In particular, the invention relates to a family of extended versions of the Generalized Viterbi Algorithm and Soft Output Viterbi Algorithm.

BACKGROUND OF THE INVENTION

A model of a prior art digital communication system is illustrated in FIG. 1. Information source 10 generates either analog or discrete information which the source encoder 11 encodes into an information sequence, x. The channel encoder 12 transforms the information sequence into a new sequence by a process known as channel encoding. Modulator 13 uses the encoded output to generate channel signals for transmission over transmission channel 14 using standard modulation methods such as amplitude, frequency, phase or pulse modulation. In general, transmission channel 14 will exhibit noise and other impairments, e.g. frequency and phase distortion and a variety of fading characteristics. Digital demodulator 15 demodulates the transmitted signal to produce an estimate of the encoded information sequence. Channel decoder 16 then takes this estimate and attempts to reproduce the information sequence using the redundant bits. Finally, source decoder 17 transforms the reconstructed information sequence, $\hat{x}$, into a form suitable for information destination 18. See generally, A. M. Michelson & A. H. Levesque, *Error Control Techniques for Digital Communications*, John Wiley & Sons, New York, 1985.

Channel encoding is a means to efficiently introduce redundancy into a sequence of data to promote the reliability of transmissions. There are at least three ways in which redundant information may be used to improve the accuracy or reliability of the received information: 1) error detection—where the decoder determines only whether the received data sequence is correct or if errors have occurred; 2) error correction—where the decoder uses the redundant information to both detect and correct errors in the received sequence; and 3) automatic repeat request—where the detection of an error will automatically initiate a request for a repeat of the data. More redundancy is required to correct errors than simply to detect errors in an encoded message. Nicholas Maslin, *HF Communications: A Systems Approach*, Plenum Press, New York, 1987. Two principle techniques employed to introduce redundancy are block coding and convolutional coding. See, e.g., S. Lin & D. J. Costello, Jr., *Error Control Coding: Fundamentals and Applications*, Prentice Hall, Englewood Cliffs, New Jersey, 1983.

An (n,k) block code takes a block of k information bits and transforms the block into an n bit codeword by adding n−k parity bits in accordance with a prescribed encoding rule. The n bit blocks are then transmitted over the communication channel. The code rate, R, is defined as R=k/n. At the receiver end of the channel, the decoder makes estimates of the original k information bits using the received sequence including the redundancy introduced by the n−k parity bits. Block codes are memoryless in that each n bit codeword output from the decoder depends only on the present k bit information block.

Convolutional codes generally operate on a stream of information bits. The stream is broken into k bit blocks. The information bits are passed into a shift register in blocks of k bits. The stages of the shift register may store v groups of the k bit blocks. The stages are connected to linear algebraic function generators. The outputs of the function generators are then selectively combined to produce the coded output of n bits. Each encoded block depends not only on the present k bit message block input to the shift register but also on the v previous message blocks. Thus, a convolutional code has memory of order v. The code rate, R, of a convolutional code is R=k/n, and the constraint length of the code is v+1. Typically, k and n are small integers and redundancy is added by increasing the length of the shift register. As is well known, the operation of convolutional encoders and decoders can be completely described in terms of either a trellis diagram or a state diagram or table. See Michelson & Levesque, supra.

The Viterbi algorithm (VA) is a well known method for decoding convolutional codes. See A. J. Viterbi, "Error Bounds for Convolutional Codes and an Asymptotically Optimum Decoding Algorithm," *IEEE Trans. Info. Theory*, Vol. IT-13, 260–269 (April 1967). The algorithm is also described in detail in G. D. Forney, Jr., "The Viterbi Algorithm," *Proc. IEEE*, Vol. 61, No. 3, 268–278 (March 1973). The VA is the optimum decoding algorithm in the sense of maximum likelihood estimation for a convolutionally encoded sequence transmitted over a memoryless channel. The basic theoretical concept of the VA can be described as correlating all possible transmitted code sequences with the received sequence and then choosing as the "survivor" the sequence where the correlation is maximum, i.e. the path with the best "metric".

When convolutional codes are used for continuous data transmission, it may be necessary to truncate survivors to manageable window or lengths, δ within the decoding trellis. Thus, the VA must come to decision on the best path through the trellis nodes up to the time i−δ. However, by framing data into blocks, and terminating the blocks by appending a number of zero bits to the last information bit for the purpose of clearing the shift register, the VA can be used to design a non-systematic block code of length N. In this case, the trellis begins and ends at the known states $s_0=(0 \ldots 0)$ and $s_N=(0 \ldots 0)$. The termination at state $s_N=(0 \ldots 0)$ is achieved by transmitting v zeros at the end of every information block. Hence, the code rate for blockwise data transmission, $R_{BL}$, is given as $$R_{BL} = R \cdot \frac{N-v}{N}$$

where N is the block length, v is the memory, and R is the code rate.

The Viterbi algorithm and the extended Viterbi algorithms described herein are explained for a rate R=½ binary convolutional code with four states. Generalization to other codes follows easily. Throughout, the discussion will proceed (without loss of generality) using blocked convolutional codes. The trellis associated with the convolutional code terminates into one known state.

A segment of a trellis for a rate R=½ convolutional code with memory v=2 is shown in FIG. 2. Since the code is of memory v=2, there are four possible states, $s_i=0,1,2,3$ associated with the respective bit patterns, $u_1u_2$, 00, 01, 10, and 11. Each of the nodes 30–33 in the trellis corresponds to a distinct state $s_i$ at a given time i, and nodes 34–37 correspond to states at time i+1. Each of the branches 40–47 represents the transition $\xi_i = (s_{i+1}, s_i)$ from state $s_i$ to some next state $s_{i+1}$ at the next time instant. Every state $s_i$ in the trellis corresponds to the possible content of the encoder shift register at time instant i. The two branches leaving every state correspond to the possible transmitted information bit $x_i \in \{0,1\}$. Upper branches 40–43 indicate a "0" is transmitted; lower branches 44–47 indicate a "1" is transmitted. Therefore, the bits attached to the possible transitions $\xi_i = (s_{i+1}, s_i)$ are equivalent to the n encoded bits, $(u_{i1}, \ldots, u_{in})$ which are generated by shifting from state $s_i$ to $s_{i+1}$, i.e. $s_i \to s_{i+1}$.

At every time instant i+1 and at any state $s_{i+1}$, the VA computes the cumulative metrics $\Gamma(s_{i+1}, s_i)$, to that instant $$\Gamma(s_{i+1}, s_i) = \Gamma(s_i) + \lambda[\xi_i = (s_{i+1}, s_i)]$$

for all possible transitions $\xi_i = (s_{i+1}, s_i)$. $\Gamma(s_i)$ is the cumulative metric up to time instant i, and $\lambda[\xi_i = (s_{i+1}, s_i)]$ is the metric increment for the transition. For the binary code considered in FIG. 2, there are always two paths merging at every state $s_{i+1}$. Out of the two possible candidates for the next decoding step, the one with the maximum accumulated metric $$\Gamma(s_{i+1}) = \max_{s_i} \Gamma(s_{i+1}, s_i)$$

is selected, and $\Gamma(s_{i+1})$ and its corresponding survivor path, $\hat{x}(s_{i+1})$, are stored for further computation. After each decoding step the time parameter i is incremented by one and the computation process is repeated until i=N. At time instant i=N only the maximum likelihood path $\hat{x}$, i.e. the path with the best cumulative metric, is left.

Hard decision or soft decision schemes may be employed in determining the best path through the trellis. In a hard decision scheme, the metric may be defined as the Hamming distance between the received word and the codewords. In a soft decision scheme, the Hamming metric is replaced by a soft decision metric, such as by computing the likelihoods of the candidate paths given knowledge of the probability distribution of the received data at the input to the decoder. See generally, J. C. Clark, Jr. & J. B. Cain, *Error—Correction Coding for Digital Communications*, Plenum Press, New York, 1982; Michelson & Levesque, supra, at 303–305. On the additive Gaussian noise channel, soft decision decoding of the demodulator output results in a performance gain of about 2–3 dB as compared to hard decision decoding. Lin & Costello, supra, at 329; Clark & Cain, supra, at 227.

The maximum likelihood approach and the soft decoding ability of the VA have made the VA useful in a wide range of applications. A convolutional code decoded by the VA in practice is often superior to a block code of equivalent complexity. Besides its applications for channel encoding, the VA can be used for equalizing channels with intersymbol interference. G. D. Forney, Jr., "Maximum Likelihood Sequence Estimation of Digital Signals in the Presence of Intersymbol Interference," *IEEE Trans. Info. Theory*, Vol. IT-18, No. 3, 363–378 (May 1972). The VA has been used for demodulation of trellis coded modulation, see G. Ungerbock, "Channel Coding with Multilevel Phase/Signals," *IEEE Trans. Info. Theory*, Vol. IT-28, No. 1, 55–67 (January 1982), as well as for demodulation of partial response continuous phase modulation. See J. B. Anderson, T. Aulin & C-E. Sundberg, *Digital Phase Modulation*, Plenum Press, New York, 1986. The VA may also be applied to problems in text and pattern recognition. As noted previously, convolutional codes can be used to design non-systematic block codes which can then be decoded optimally by the VA. Thus, the VA is used to advantage not only in decoding convolutional codes but also with a variety of other codes and other transmission techniques, all of which can generally be characterized by a trellis like structure.

Unlike block codes, the maximum likelihood decoder for convolutional codes and other trellis-based structures is complete in that it decodes every received sequence. Thus, decoders for convolutional codes generally lack the ability to signal a warning in the event of potential decoding error. An improvement in the performance of concatenated coding systems (i.e. systems with multiple levels of encoding) could be obtained if the VA, used as the inner decoder, could signal a warning in the event of a potential decoding error to an outer stage of processing. In other words, if the VA could deliver additional information, such as an indicator of the reliability of the decoding, to an outer stage of processing, then the system performance could be improved. This is particularly true where the outer coder is a speech (source) coder. See, e.g., N. Seshadri & C-E. W. Sundberg, "Generalized Viterbi Algorithms for Error Detection with Convolutional Codes," *Conf. Rec. IEEE GLOBECOM '89*, 1534–1538, Dallas, Tex., November 1989; W. C. Wong, N. Seshadri and C-E. W. Sundberg, "Estimating Unreliable Packets in Subband Coded Speech," *Conf. Rec. IEEE GLOBECOM '90*, 1979–1983, San Diego, Calif., December 1990.

A block diagram of a prior art communication system employing a concatenated coding architecture is shown in FIG. 3. In this system, the information source 20 generates either analog or discrete information. Outer encoder 21 transforms the signal from information source 20 into a sequence of information bits and encodes the sequence. Interleaver 22 serves to distribute the channel impairments, such as fading or noise bursts, over a plurality of blocks thus lessening the effect of the impairment on any single block. An interleaver may be considered an element for processing signals using a rectangular array. Encoded data is read into the array by rows and is read out by columns. Inner encoder 23 encodes the sequence output by interleaver 22 and also generates the modulation signal which will be transmitted over channel 24. Inner decoder 25 demodulates the received signal and performs the first step in the decoding process. Deinterleaver 26 reorders the output sequence from the inner decoder. Outer decoder 27 transforms the deinterleaved sequence into an estimate of the original information sequence and transmits the estimate to destination 28.

Since 1967, several publications have appeared extending the classical VA by adding parallel or serial processing units to the Viterbi decoder. In these units information lost due to selecting only the path with the best metric is taken into account, and additional information is delivered to an outer stage of processing. There are two general groups of extended Viterbi algorithm processors: the first group, known as soft symbol output Viterbi algorithms, uses the difference between the accumulated metrics of the two paths merging at each state as measure of the reliability of the transmitted information sequence. The second group, known as list or general output algorithms, in addition to finding the best path or survivor, computes the best next L–1 paths.

The first group of processors was introduced in 1971 by Clark and Davis who described an extended Viterbi Algorithm that delivered, in addition to the decoded information sequence, a two-valued reliability indicator $\hat{L}$, where $\hat{L} \in \{0, 1\}$. G. Clark & R. Davis, "Two Recent Applications of Error-Correction Coding to Communications System Design," *IEEE Trans. Comm.*, Vol. COM-19, No. 5, 856–863 (October 1971). Based on the earlier work of Forney, see G. D. Forney, "The Viterbi Algorithm," *Proc. of IEEE*, Vol. 61, No. 3, 268–278, (March 1973), Schaub and Modestino introduced an Erasure Declaring Viterbi decoding Algorithm (EDVA), which calculates, for all the merging paths at one state, the difference between their metric and the metric of the survivor path. If this difference was lower than a defined threshold, all the positions in the survivor path in which the two paths differ were erased. T. Schaub & J. W. Modestino, "An Erasure Decoding Viterbi Decoder and Its Application to Concatenated Coding System," ICC'86, IEEE Conf. Rec. No. CH2314-3/186, 1612–1616, 1986.

Hagenauer and Hoeher have developed the Soft-Output Viterbi Algorithm (SOVA). See J. Hagenauer and P. Hoeher, "Concatenated Viterbi-Decoding," *Fourth Joint Swedish-Soviet Int. Workshop on Inf. Theory*, Gotland, Sweden, Studentlitteratur, Lund, 29–33 (August 1989). This algorithm delivers, for each decoded information bit, an analog reliability value $\hat{L}$, where $\hat{L} \epsilon R^+$. For every survivor path $\hat{x}(s_i)$ a reliability vector $\hat{L}(s_i)$ exists, which is initialized in all positions to a high value. At every time instant i and at any state $s_i$, the absolute difference, $\Delta_i(s_i)$, between the accumulated metrics of the two paths merging at this point is computed. The absolute difference, $\Delta_i(s_i)$, is stored in all those positions of the reliability vector, $\hat{L}_i(s_i)$, where the two paths within a chosen update window $\delta_{up}$ differ, and where the existing reliability value, $\hat{L}_i(s_i)$, is higher than $\Delta_i(s_i)$ ($\min\{\Delta_i(s_i), L_i(s_i)\} \rightarrow \hat{L}_i(s_i)$). This updating process guarantees that, for every decoded information bit, $\hat{x}_i$, the lowest reliability value, $\hat{L}_i$, is delivered to an outer stage of processing. It is important to note that the SOVA always requires interleaving and deinterleaving units to avoid correlation of the output bits.

The second group of processors, known as List output Viterbi Algorithms (LVA), or Generalized Viterbi Algorithms (GVA), were first introduced in 1973 by Forney, supra, who proposed altering the VA to produce the L best paths rather than the single best path. In 1987 Hashimoto introduced the Generalized Viterbi Algorithm (GVA) which selects the L best survivors from each of the lists of candidates at each decoding step. T. Hashimoto, "A List-Type Reduced-Constraint Generalization of the Viterbi Algorithm," *IEEE Trans. Info. Theory*, Vol. IT-33, No. 6, 866–876 (November 1986).

Seshadri and Sundberg have presented versions of the GVA that produce a rank ordered list of the L globally best candidate paths after a trellis search. In a parallel version (PGVA), L survivors are selected simultaneously at each decoding step out of a list of 2·L candidates (assuming a binary code). These L survivors are then extended in the next decoding step. After the block is transmitted, an outer decoder chooses the optimal candidate from the list of the L survivors. Another version, the Serial Generalized Viterbi Algorithm (SGVA), iteratively finds the $l^{th}$ best path based on the knowledge of the previously found (l–1) best paths, where $1 < l \leq L$. An application for a patent on this invention was granted to Seshadri and Sundberg on May 4, 1993, U.S. Pat. No. 5,208,816 and is assigned to the assignee of this application. Recently the more precise name List output Viterbi Algorithm (LVA) has been used in referring to the GVA. Here the more general name "GVA" is used as cited in the literature.

Both the SOVA and GVA extensions of the Viterbi algorithm improve decoding performance. However, use of the SOVA and GVA add additional complexity and cost to decoding systems.

SUMMARY OF THE INVENTION

The present invention discloses a family of modified and extended versions of the Generalized Viterbi Algorithm (GVA) and Soft Output Viterbi Algorithm (SOVA) that avoid many of the disadvantages of prior versions. The present invention exploits the SOVA (GVA) structure in implementing a lower complexity version of the GVA (SOVA). These extended versions are illustratively applied in the present disclosure to convolutional codes, though they apply also to block and other types of codes, various modulation techniques, and other trellis-based structures.

In accordance with one aspect of the present invention, the structural aspects of a SOVA are used to develop a new implementation for a Serial GVA (SGVA) in which the length of the list L of possibly transmitted sequence is adaptable or controllable. The implementation iteratively finds the L best paths through a decoding trellis using the absolute differences between the cumulative metrics of the paths at the nodes of the trellis. Knowledge of the minimum absolute difference and value of the cumulative metric of the best path is used to successively calculate the $(l+1)^{th}$ most likely path based on the previously found l best paths.

In another embodiment of the present invention a low complexity SOVA based on the GVA is described. This "Soft-GVA" accepts the list output of a GVA and calculates an output symbol reliability measure for each decoded symbol. The absolute differences in the accumulated metrics of the best path and $l^{th}$ best path are advantageously used in a soft initialization of the reliability measures.

In accordance with a further embodiment, a GVA is disclosed which advantageously uses the reliability information of a SOVA to generate a list of size L, which has a lower complexity than a GVA for an identical longer length list size. This "1 State GVA" uses reliability values calculated by the SOVA in a one state trellis for computing the L best paths.

BRIEF DESCRIPTION OF THE DRAWINGS

Other features and advantages of the invention will become apparent from the following detailed description taken together with the drawings in which.

DETAILED DESCRIPTION

I. Introduction

Figure 3:
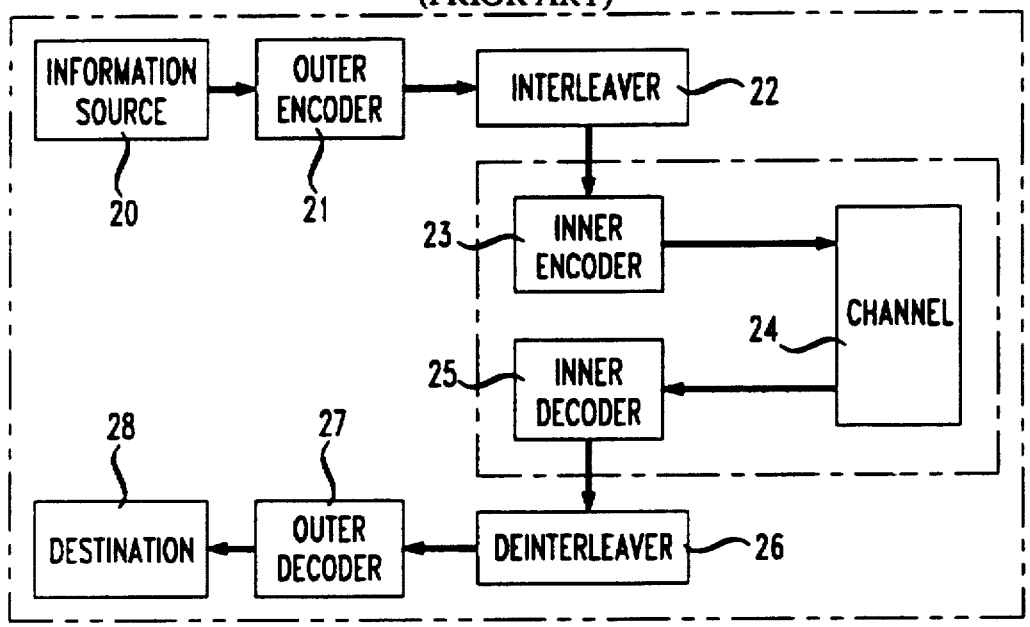
FIG. 3 illustrates the structure for a communication system using concatenated coding.

FIG. 3 presents an illustrative embodiment of the present invention which advantageously operates as inner decoder 23 in a concatenated coding system. This section provides an introduction to the extended List Output and Soft Symbol Output Viterbi Algorithm techniques. Section II presents a detailed description of an illustrative embodiment of a SGVA implementation. Sections III and IV describe illustrative embodiments of extended Viterbi algorithms based on GVA and SOVA techniques respectively.

The SOVA and the GVA are two classes of processors or decoders used to extend or modify the Viterbi algorithm. The SOVA delivers reliability information, $\hat{L}$, for each decoded output symbol, $\hat{x}_i$, to an outer stage of processing. The function of the SOVA is not to lower the bit error rate but to improve the signal-to-noise ratio relative to the outer code by delivering reliability information $\hat{L}$ for each of the decoded output symbols. This implies that the optimal outer stage processor (decoder) in the concatenated coding system accepts soft input data or has the ability to post-process the reliability values $\hat{L}_i$. Thus, error correction codes, such convolutional codes, are considered as outer codes. Contrastingly, the GVA provides an outer stage of processing with a list of the L best estimates of the transmitted data sequence. Therefore, the outer stage processor has to fulfill the task of selecting the optimal candidate out of a list of L possible candidates. Possible outer codes for the GVA are error detection codes, such as parity check codes, or in speech communication systems a speech predictor can perform the task. Thus, the considered algorithms—GVA and SOVA—not only differ in their structure, but they also provide different information to an outer stage of processing.

However, in spite of conceptual and structural difference between the SOVA and GVA, both algorithms contain information about erroneous decisions of the Viterbi decoder. For the SOVA the absolute differences between the cumulative metrics of two paths at the nodes of the trellis, $\Delta_i(s_i)$, are indicators of the reliability of the VA decoding decisions. The absolute difference is defined as:

$$\Delta_i(s_i) = max\Gamma(s_{i+1}, s_i) - min\Gamma(s_{i+1}, s_i) \geq 0$$

A low value of the absolute difference indicates that the decision of the VA at time instant i and state $s_i$ is less reliable. The reliability values $\hat{L}$ of the SOVA output, which are calculated by these differences $\Delta_i(s_i)$ contain indirect information about the L best estimates of the transmitted data sequence and could be therefore used to generate a list of size L. In an illustrative embodiment this invention provides a List-SOVA in which these absolute differences, $\Delta_i(s_i)$, can be used to generate the L best estimates of a transmitted data sequences. Similarly, in another illustrative embodiment the list output of the GVA is used to deliver reliability information on a symbol by symbol basis. This embodiment of the invention is called a Soft-GVA. It should be noted that the List-SOVAs (Soft-GVAs) have the same data transmission format and structure as the SOVA (GVA). The difference from the original versions are only the serial post-processing units which change the output format from soft output to list output or from list output to soft output.

Decoding operations in this illustrative embodiment of the present invention advantageously use Soft-GVA and List-SOVA techniques. A new implementation for the Serialized Generalized Viterbi Algorithm is introduced in Section II. Section III presents an illustrative embodiment of a Soft Symbol Output Viterbi Algorithm based on the GVA. Section IV presents an illustrative embodiment of a List Output Viterbi Algorithm using the SOVA.

As is usual in descriptions of coding in other contexts which are conveniently described in terms of trellis structures, it is useful to consider the all-zero sequence as typical. The results that follow are not thereby limited in generality. Throughout this specification, binary codes have been used for illustrative purposes; however, those of ordinary skill in the art will recognize that generalization to non-binary codes is readily accomplished for the embodiments described.

II. SGVA Implementation

This section describes an embodiment on of the Serial Generalized Viterbi Algorithm (SGVA). This aspect of the invention iteratively finds the L best paths of the transmitted sequence through a decoding trellis, advantageously using the absolute differences $\Delta_i(s_i)$ between the paths merging at each state as computed by SOVA decoding. First, a simplified computational technique is introduced which is useful when the sequence to be processed has been encoded using a maximum free distance binary convolutional code. Next, an embodiment of a SGVA, useful for processing sequences generally, is presented.

Figure 1:
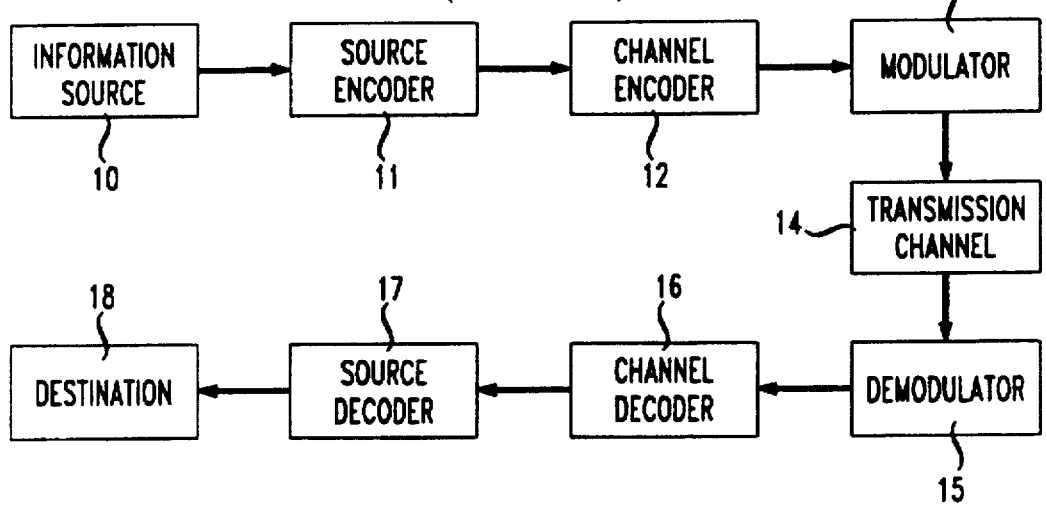
FIG. 1 illustrates a generalized block diagram of a digital communications system.
Figure 2:
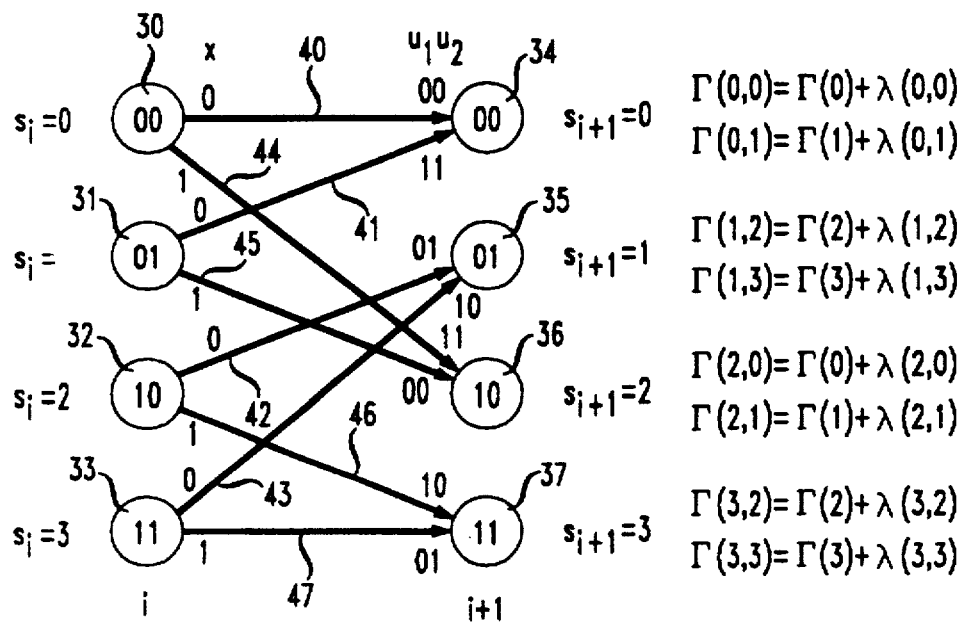
FIG. 2 illustrates one segment of a trellis structure for decoding a rate one half convolutional code.

Due to the conveniently assumed binary structure of the convolutional code, the two branches merging and leaving each state $s_i$ in FIG. 2 are associated with complementary transition bits $u_i = (u_{i,1}, \ldots, u_{i,n})$. This together with the linearity of the code implies that the metric increments $\lambda[\xi_i = (s_{i+1}, s_i)]$ of the two branches leaving and merging at each state $s_i$ are also inverted. Using this symmetry of the binary convolutional code, the number of required metric increments can be reduced. Only $2^{v-1}$ instead of $2^{v+1}$ metric increments $\lambda$ need to be calculated. This is a decrease in the computation process by a factor of 4.

Figure 4:
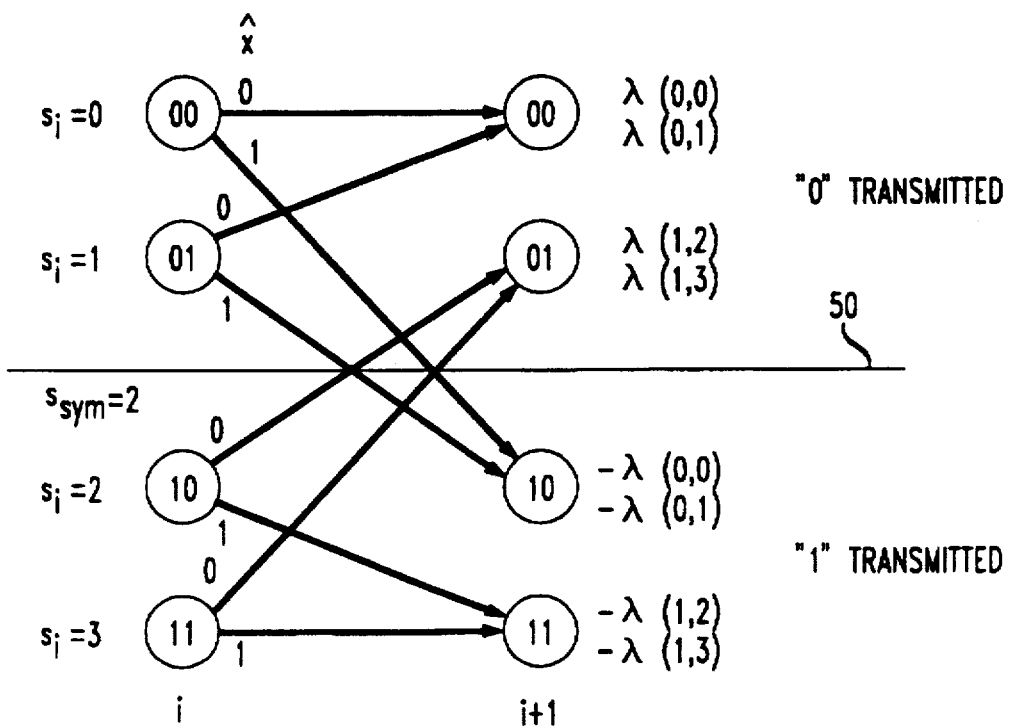
FIG. 4 illustrates one segment of a trellis structure for decoding a rate one half convolutional code with a symmetry line for reduced metric computations.

A symmetry line 50 through the trellis stage of FIG. 2 is introduced at state $$s_{sym} = S/2 = 2^{v-1}$$

as shown in FIG. 4 for a code with memory v=2, code rate R=½ and total number of states S=4. The symmetry line 50 divides the states $s_{i+1}$ into two groups. For the $2^{v-1}$ uppermost states $s_{i+1}$ a "0" is transmitted, otherwise the transmitted information bit is "1". This fact can be used to limit the required storage of the VA decoder. During forward computation of the VA, only the integer value of the state $s_i$ (the state where the current survivor path $\hat{x}(s_{i+1})$ came from) need be stored. Later, in the decision process, the state value $s_i$ is compared to the symmetry line $s_{sym}$, and the value of the received information bit $\hat{x}_i$ is determined as follows:

$$s_i < s_{sym} \rightarrow \hat{x}_i = 0$$

$s_i \geq s_{sym} \rightarrow \hat{x}_i = 1.$

The two branches leaving each state $s_i$ have, due to inverse information bits, inverted metric increments $\lambda[\xi_i=(s_{i+1},s_i)]$, as shown in FIG. 4. Therefore, only metric increments $\lambda[\xi_i=(s_{i+1},s_i)]$ for states $s_{i+1}<s_{sym}$ need be computed. For states $s_{i+1} \geq s_{sym}$, the metric increments are inverted:

$$\lambda(s_{i+1},s_i)=-\lambda(s_{i+1}-s_{sym},s_i)$$

Figure 5:
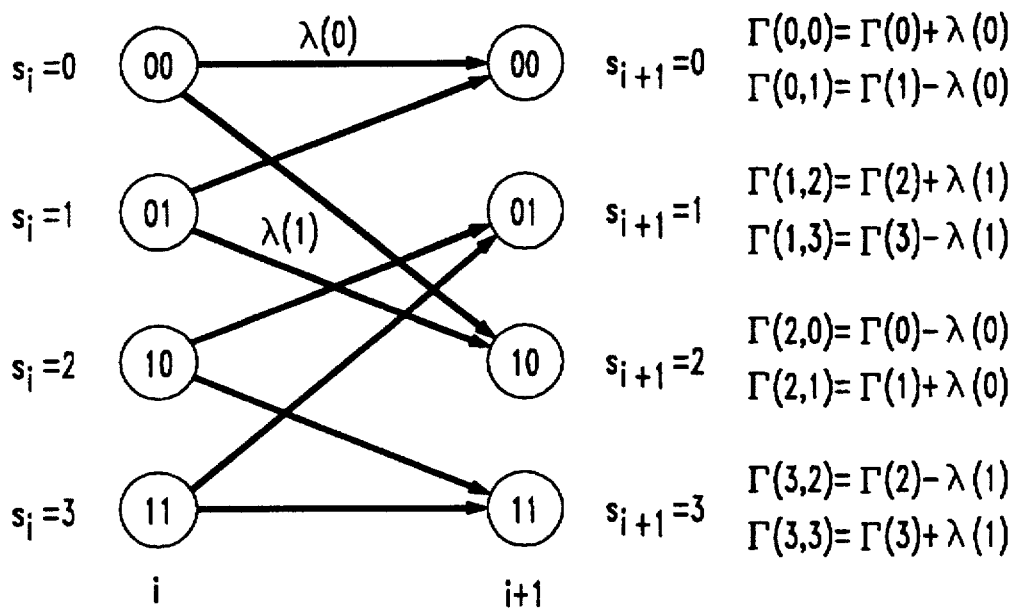
FIG. 5 illustrates one segment of a trellis structure for decoding a rate one half convolutional code with more efficient computation of the cumulative metrics.

This decreases the computation process by a factor of 2. The metric increments $\lambda[\xi_i=(s_{i+1},s_i)]$ of the two paths merging at each state $s_{i+1}$ are inverted because the content of the shift register $s_i$ differs only in the lease significant bit. Hence, one can introduce a new definition for the metric increments:

$$\lambda(s_{i+1})=\lambda[\xi_i=(s_{i+1},s_i)]$$

$$s_i=0,2,4,\ldots,S-2;\ s_{i+1}<s_{sym}$$

and a new definition for the cumulative metrics:

$$\Gamma(s_{i+1},s_i)=-\Gamma(s_i)+(-1)^{x_i}\cdot\lambda(s_{i+1})$$

$$s_{i+1}=0,1,\ldots,S-1$$

with $$\lambda(s_{i+1})=-\lambda(s_{i+1}-s_{sym})s_{i+1}\geq s_{sym} \quad (1)$$

where the factor $(-1)^{s_i}$ reflects the inversion of the metric increments $\lambda(s_{i+1})$ of the two paths merging at any state $s_{i+1}$. In (1) only metric increments for the transmitted information bit "0" are considered ($s_i=0,2,4,\ldots,S-2$). Instead of computing $2^{v+1}$ metric increments $\lambda[\xi_i=(s_{i+1},s_i)]$ at each decoding step, only $2^{v-1}$ metric increments $\lambda(s_{i+1})$ need be calculated. The reduction by a factor of 4 can be obtained for optimal binary codes with an underlying shift register structure. In FIG. 5 this new technique is shown for a code with memory v=2, R=½.

It will be recalled that the serial version of the Generalized Viterbi Algorithm (SGVA) finds the L most likely candidates one at a time. Using the knowledge of the previously found l−1 best candidates the SGVA iteratively calculates the $l^{th}$ most likely candidate. A new implementation of the SGVA for a binary code is next presented which uses the absolute differences $\Delta_i(s_i)$ between the cumulative metrics of the two paths merging at each state $s_i$ to identify the next best candidate. It proves advantageous to consider only terminated data sequences $\{x_i\}$ of the length N (blockwise data transmission) are considered.

Assume metric increments $\lambda(s_i)$, cumulative metrics $\Gamma(s_i)$ or optionally absolute differences $\Delta_{i+1}(s_{i+1})$ are conveniently stored during the standard VA forward computation for every time instant i and each state $s_i$. Also, it proves convenient to assume a main path state array is available. With the knowledge of the two cumulative metrics $\Gamma^{(m)}(s_i)$ at time instant i and with knowledge of the metric increments $\lambda(s_{i+1})$ at time instant i+1, for each state $s_{i+1}$ the absolute difference $\Delta_{i+1}(s_{i+1})$ can be calculated. Let the cumulative metric $\Gamma^{(1)}(s_i)$ related to the upper branch be labeled by m=1. Using the notation of the metric increments used previously and the symmetrical line $s_{sym}=2^{v-1}$, the absolute difference $\Delta_{i+1}(s_{i+1})$ at each state $s_{i+1}$ is computed as follows:

$$s_{i+1}<s_{sym}:\Delta_{i+1}(s_{i+1})=|\Gamma^{(1)}(s_i)-\Gamma^{(2)}(s_i)+2\cdot\lambda(s_{i+1})|$$

$$s_{i+1}\geq s_{sym}:\Delta_{i+1}(s_{i+1})=|\Gamma^{(1)}(s_i)-\Gamma^{(2)}(s_i)+2\cdot\lambda(s_{i+1})|.$$

Figure 6:
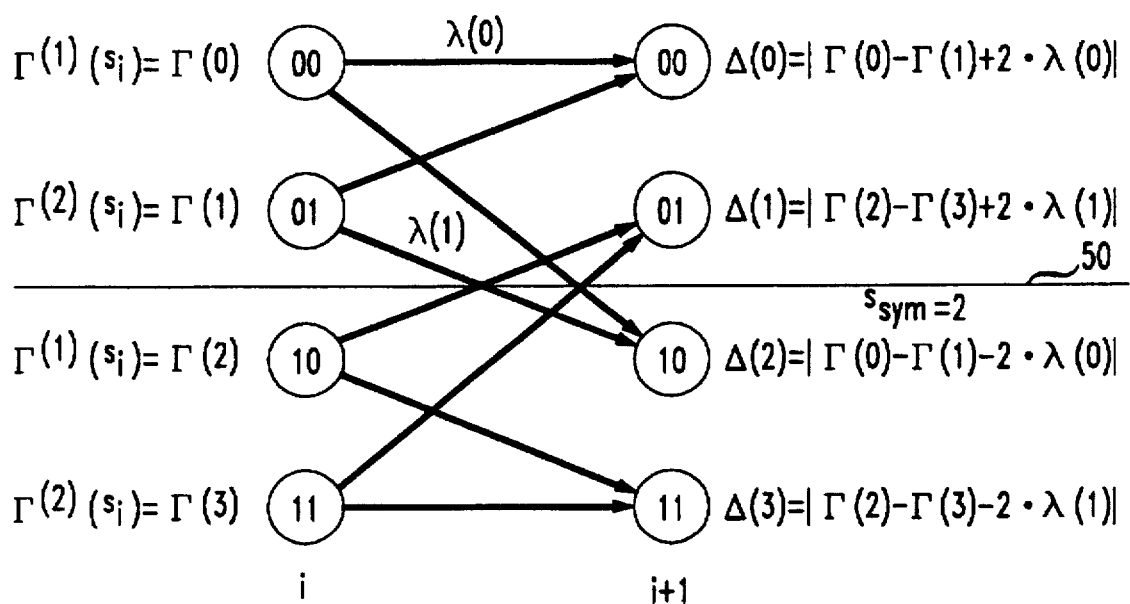
FIG. 6 illustrates the computational steps in determining the absolute difference to implement a Serial Generalized Viterbi Algorithm.

This computation step is illustrated in FIG. 6. This step is optional resulting in a streamlined computation. For a short list, high signal-to-noise ratio or a code of high complexity (high code memory) it is advisable to store the metric increments and the cumulative metric during forward computation and compute the absolute differences only when the next best path is required.

Figure 7:
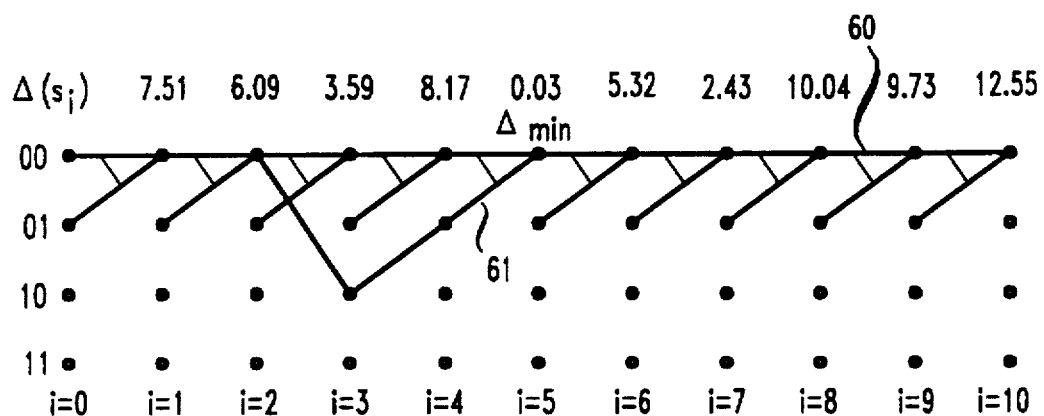
FIG. 7 illustrates the second best path through a trellis by identification of the point in the trellis with the minimum absolute difference.

The absolute differences $\Delta_i(s_i)$ contain indirect information about the globally second best path, third best path, etc. as follows:

First, assume the best estimate of the transmitted data sequence $\{x_i\}$ is the all-zero path 60, as shown in FIG. 7 for a code with memory v=2 and block length N=10. For every time instant i, the absolute differences $\Delta(s_i)$ along the best path are known. Thus, the main path state array can be used to identify the path sequence and calculate $\Delta_i(s_i)$ as described above or used to the store $\Delta_i(s_i)$ values. Now a search is made along the best path 60 for the minimum difference:

$$\Delta_{min} = \min_N \{\Delta_i(s_i)\}$$

The minimum difference $\Delta_{min}$ at time instant i=5 in FIG. 7 implies that the second best path 61 re-merges with the best path at time instant i=5. The values of the absolute differences $\Delta_i(s_i)$ in FIG. 7 are arbitrary. Using the main path state array the second best path 61 is created. The position of the re-merging point (i=5) is stored.

Figure 8:
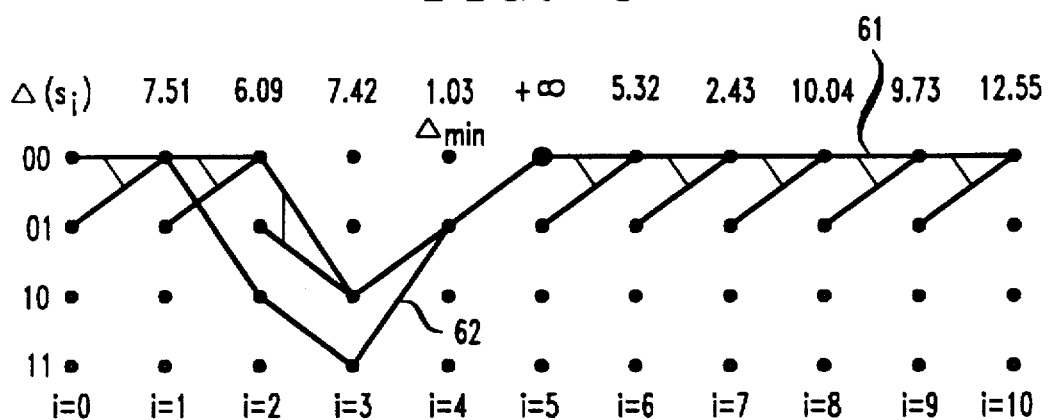
FIG. 8 illustrates one possible candidate for the third best path through a trellis based on the second best path by computing absolute difference between the merging and re-merging points.

Next, to generate a candidate for the third best path 62, the differences $\Delta_i(s_i)$ along the second best path are initialized with the absolute difference values $\Delta_i(s_i)$ of the best path as shown in FIG. 8. Additionally, only the differences from the "re-merging point" (i=5) to the "merging point" (i=2) need be computed, compare FIG. 7. Then, another candidate for the third best path 63 is identified from the best path. Further, the re-merging point in both difference sequences is set to a high value, $\Delta_{i=5}(s_{i=5})=+\infty$, which implies this point is excluded in both path sequences to be identified as a re-merging point (see FIG. 9). For both path sequences the minimum difference $\Delta_{min}$ is found. This implies there are now two potential candidates, 62 and 63, for the third best path. To select the candidate, the cumulative metrics at state $s_N=(0\ldots0)$ is calculated for both possible candidates then the one with the higher metric $\Gamma(s_N=0)$ at state $s_N=(0\ldots0)$ is selected as the third best estimate of the transmitted data sequence. The related information sequence can be computed by using the main path state array.

With the knowledge of the minimum difference $\Delta_{min}$ and the value of the cumulative metric $\Gamma^{best}(s_N=0)$ of the best path at state $s_N$, the cumulative metric $\Gamma^{2nd\ best}(s_n=0)$ of the second best path at time instant $s_N=(0\ldots0)$ is calculated:

$$\Gamma^{2nd\ best}(s_N=0)=\Gamma^{best}(s_N=0)-\Delta_{min} \quad (2)$$

Note that this step can be easily generalized for the next best candidate to the $l^{th}$ best path.

Figure 9:
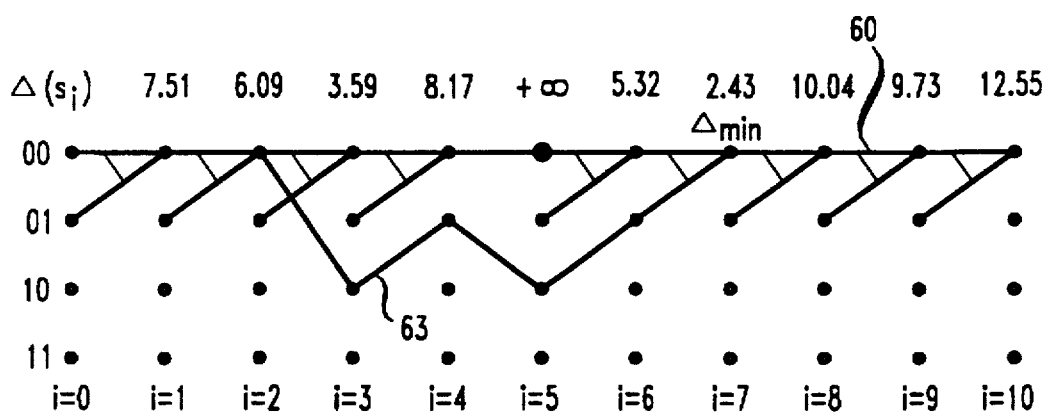
FIG. 9 illustrates another possible candidate for the third best path through a trellis based on the best path by identification of the point with the minimum absolute difference.

Assume the third best candidate 63 re-merged with the best path 60 at time instant i=7 as illustrated in FIG. 9. To identify the fourth best path, the differences along the third best path are initialized with the values of the absolute differences of the best path and then the differences between merging point and re-merging point are calculated, and the re-merging point in both path sequences is excluded. Further, for the best and the third best path the minimum difference $\Delta_{min}$ is found which implies the re-merging point of the next possible candidates for the fourth best path. Based on equation (2) the cumulative metrics at state $s_N=(0 \ldots 0)$ is computed for these two candidates. The final candidate for the fourth best path based on the globally second best path is the former candidate for the third best path 62. This candidate path already exists, and thus the cumulative metric for this path need not be calculated. The fourth best path is the candidate path with the maximum metric. Note that for each new list element only two new possible candidates need be calculated. Thus, the $l^{th}$ best path is found by estimating for each of the previously found l−1 best paths the next best candidate and its cumulative metric at state $s_N=(0 \ldots 0)$. Candidate paths which are identical to paths already on the list of possible candidates are eliminated.

Figure 10:
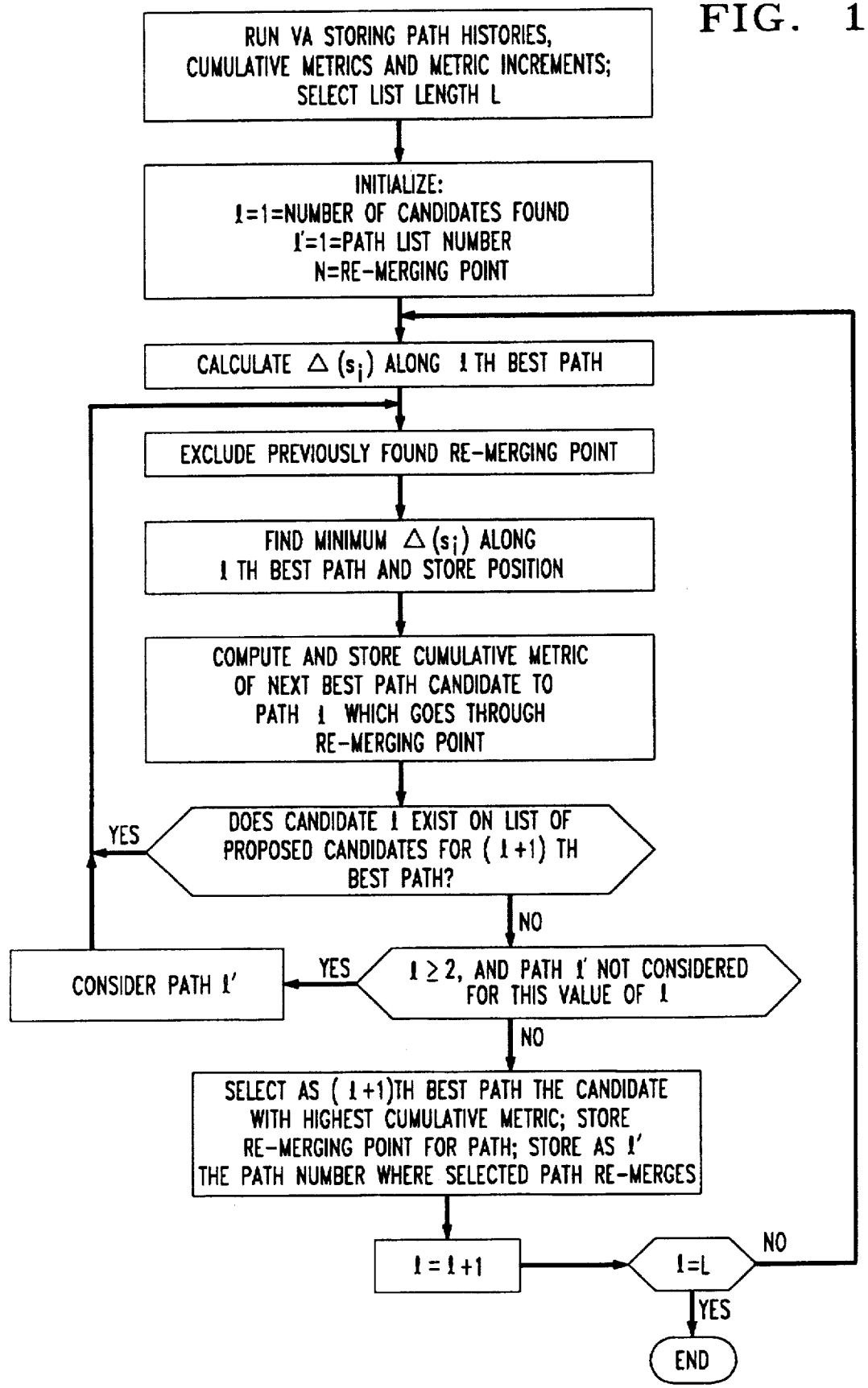
FIG. 10 illustrates the steps required to formulate a Serial Generalized Viterbi Algorithm based on a Soft Symbol Output Viterbi Algorithm implementation.

An illustrative formulation of the Serial GVA (SGVA) comprises the following steps as illustrated in the flow chart in FIG. 10:

Step 1:

Create a main path state array of size $2^v \times N$, a metric increment array of size $2^{v-1} \times N$ and a cumulative metric array of size $2 \times N$. The entry $E_{ij}$ in the main path state array is a summary of the history of the best path that terminates in state $s_{i-1}$ at time j. Further, create an array as a storage for the L best paths of size $L \times N$ and an array for the absolute differences along the L best paths of size $L \times N$. Also, provide three auxiliary arrays each of size $L \times 1$, the first one, z(l), to store the re-merging points of the $l^{th}$ best path and its next candidate. The second auxiliary array is used as a storage for the cumulative metrics at state $s_N=(0 \ldots 0)$ of the next possible candidates. The third auxiliary array stores the cumulative metrics at state $s_N=(0 \ldots 0)$ of the L best paths.

Step 2:

Execute a Viterbi Algorithm, and store at each time instant i and for every state $s_i$ the history of the paths, the cumulative metrics and the metric increments.

Step 3:

Initialize the number of candidates found, l=1.

Initialize the list number, l', to 1 where l' is the list number of the path with which the $(l+1)^{th}$ best path re-merges, l'=1.

Initialize the last re-merging point, i.e. set z(1)=N. Set m=1, where m is an auxiliary parameter.

Step 4:

Calculate and store along the $m^{th}$ best path the absolute differences.

Step 5:

Exclude the previously found re-merging point z(m), (e.g. set $\Delta(s_{i=z(m)})=+\infty$).

Step 6:

Find the minimum absolute difference $\Delta_{min}=\min_N\{\Delta(s_i)\}$ along the $m^{th}$ best path and store the position in z(m) and in the provided array.

Step 7:

Compute and store the cumulative metric $\Gamma(s_N=0)$ at state $s_N=(0 \ldots 0)$ of the next best candidate to path m, which goes through the re-merging point z(m), described in Step 6.

Step 8:

Test if candidate m exists on the list of proposed candidates for the $(l+1)^{th}$ best path. If so, repeat steps 5 to 8.

Step 9:

If $l \geq 2$, repeat steps 5 to 8 for path l' with m=l'.

Step 10:

For all l possible candidates for the $(l+1)^{th}$ best path, select the one with the highest cumulative metric $\max\Gamma(s_N=0)$ at state $s_N=(0 \ldots 0)$. This candidate is the $(l+1)^{th}$ best path of the transmitted data sequence. Store as l' the list number of the path with which the $(l+1)^{th}$ best path re-merges. Store the re-merging point in z(l) and z(l'). Set m=1.

Step 11:

Set l to l+1 and repeat steps 4 to 11 until l=L.

III. A Soft Symbol Output Viterbi Algorithm Based on the GVA (Soft-GVA)

This section describes an embodiment of a low complexity Soft Symbol Output Viterbi algorithm that accepts the list output of the GVA and calculates a reliability value for each of the decoded information bits. This embodiment is called a Soft-GVA. The algorithm advantageously uses the differences in the accumulated metrics of the best path and the $l^{th}$ best path ($1<l\leq L$) of the GVA as a measurement of reliability of each decoded bit.

Figure 11:
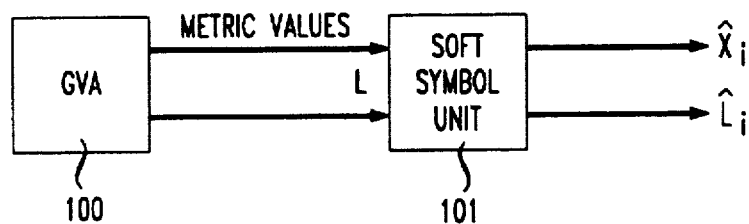
FIG. 11 illustrates a block diagram of a Soft-GVA.

An illustrative block diagram of the principle of the Soft Symbol Output Viterbi Algorithm based on the Generalized Viterbi Algorithm is shown in FIG. 11. GVA 100, such as that described by Seshadri et al. above, outputs the metric values and the list L of possible sequences. Soft symbol unit 101 uses the list to produce the decoded symbol and a reliability measure for that symbol. Note also that for the Soft-GVA illustrated here, the data sequence originally encoded is a block of N bits with N−v information bits and with v bits used to terminate the blocks. In the SGVA described above the $l^{th}$ best path was identified using the knowledge of the absolute differences $\Delta_i(s_i)$ and evaluating for each of the l−1 proposed candidates the cumulative metric $\Gamma(s_N=0)$ at state $s_N=(0 \ldots 0)$, where $1 \leq l \leq L$. With knowledge of the L best path sequences and their corresponding cumulative metrics, a Soft-GVA or Soft Symbol Output algorithm can be constructed based on the GVA.

In the SOVA the absolute differences $\Delta_i(s_i)$ between the cumulative metrics of the two paths merging at state $s_i$ is a measure of the reliability of the decision of the VA decoder. For the GVA a measurement of the reliability of the decision of the VA decoder is found in the difference between the cumulative metrics $\Gamma(s_N=0)$ at state $s_N=(0 \ldots 0)$ of the best path and the $l^{th}$ best path, $2\leq l\leq L$. Denote this difference $\Delta_l^*$, where $2\leq l\leq L$. Note that the difference between the best and second best path, $\Delta_2^*$ would also be obtained by a SOVA in blockwise data transmission. Reliability values for the decoded information bits may be obtained using the following method where step 1 describes the initialization procedure and steps 2–5 describe the updating procedure:

1. Initialize all positions of a reliability vector, $\hat{L}$, of length (N−v) with a constant value $C_1$, where $C_1 \in R^+$.
2. Note that for path l the cumulative metric $\Gamma(s_N=0)$ at state $s_N=(0 \ldots 0)$ is available (see SGVA implementation above).
3. Calculate for the $l^{th}$ best path the difference between its cumulative metric and the cumulative metric of the best path at state $s_N$:

$$\Delta_l^* = \Gamma_{best}(s_N=0) - \Gamma^{l^{th}best}(s_N=0).$$

The differences $\Delta_l^*$ obtained are always elements of the positive real numbers $\Delta_l^* \in R^+$, where $2\leq l\leq L$.

4. Then compare the information bit sequence of the $l^{th}$ best path to the information bit sequence of the best path and determine the position of the information bits where the two paths differ.
5. In all those positions where the best path and the $l^{th}$ best path differ, store when the existing reliability value is higher the difference $\Delta_l^*$, i.e. ($\hat{L} \leftarrow \min\{\hat{L}, \Delta_l^*\}$).
6. Repeat steps 2–5 for $1<l\leq L$. This implies for a list of size L a maximum of (L−1) updates per decoded information bit.

Figure 12:
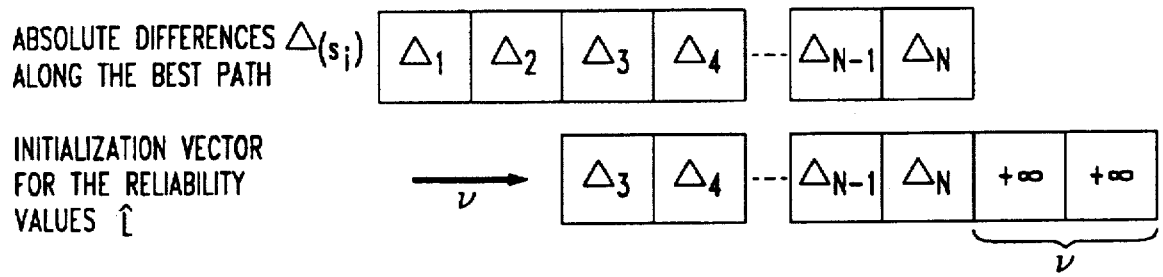
FIG. 12 illustrates the principle of soft initialization for a Soft-GVA.

Improved performance can be obtained using "soft" initialization as opposed to initializing with constant $C_1$. Recall that the SGVA uses the absolute differences $\Delta_i(s_i)$ to find its next best estimate of the transmitted data sequence. During the search for the second best path these absolute differences $\Delta_i(s_i)$ can be stored in an auxiliary array as shown in FIG. 12. To obtain a "soft" initialization this auxiliary array is shifted by the number of transmitted tail bits (v), and then the reliability vector is initialized with these shifted values. FIG. 12 illustrates a shift for a v=2 code. This process is equivalent to a performance of the SOVA using an update window of length $\delta_{up}=v+1$. After initializing the reliability vector with these shifted soft values, steps 2 through 5 above are then used to update the reliability vector and to generate a reliability value for each symbol. This implementation of the initialization is called a "1 Update SOVA."

Note that other initialization schemes are possible. For example, an updating process with "normalized" values may be used. In this embodiment, the differences $\Delta_i^*$ are computed as above. The reliability vector of length N is initialized in all positions to a value of 1. Next, the positions of where the information bits in the best path and $l^{th}$ best path, $2 \leq l \leq L$, differ are determined. The differences are then normalized as follows:

$$\overline{\Delta_i^*} = \frac{\Delta_i^*}{\Gamma^{best}(s_N = 0)}$$

and the updating process is the same as for the Soft-GVA with fixed initialization values substituting $\overline{\Delta_i^*}$ for $\Delta_i^*$. Likewise, a flexible initialization value technique may be used. This technique uses the maximum cumulative metric for each block of data and recognizes that the cumulative metric contains indirect information about the channel quality during transmission of the block. A higher correlation (higher $\Gamma^{best}(s_N=0)$) indicates that the block performance is more reliable. However, we can initialize each block individually independent of the channel quality with value:

$$\text{initialization value} = \Gamma^L(s_N=0)+C_2$$

where the constant $C_2$ is an element of the positive real numbers. The initialization values of the reliability vector differ from one block to the next. To obtain the Soft-GVA, the procedure is the same as for fixed initialization values with $\Delta_i^*$. After deinterleaving, when the deinterleaver is chosen large enough, each of the output bits has a different reliability value.

IV. A List Output Viterbi Algorithm Using the SOVA (List-SOVA)

This section describes a list output algorithm which advantageously adds to the SOVA a list generating unit of relatively low complexity which uses the reliability values $\hat{L}$ to generate a list of size L. The SOVA alone generates, sequentially and continuously, soft output symbols $\hat{L}_i$ where the amplitude of each symbol contains the reliability information for that symbol. The SOVA is an algorithm of fairly high complexity. However, with an additional low complexity list generating unit, the complexity of the List-SOVA (SOVA and list generating unit) is typically lower for a longer list of size L than the complexity of a corresponding GVA. Two possible techniques of list generating units which use the SOVA output to generate a list of size L are discussed. To develop the low complexity list generating unit the following items are noted:

1. The GVA illustratively operates on terminated data sequences of length N, but those skilled in the art will recognize that data sequences other than terminated data sequences may be used. Thus, each list element of the GVA output has the length N.

2. As a consequence of item 1, the list generating unit has to produce L output sequences each of length N. In a continuous data transmission scheme, the length could also be N–v, because the N bits in blockwise data transmission include the v tail bits that contain no information and are used to terminate the data sequence in state $s_N=(0 \ldots 0)$.

Figure 13:
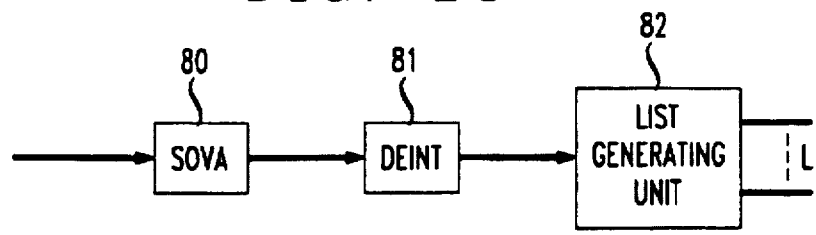
FIG. 13 illustrates a block diagram of a List-SOVA.

3. The SOVA is applied to a continuous data transmission scheme and therefore requires (de)interleaver units. This implies the addition of deinterleaver 81 between SOVA 80 and list generating unit 82 as shown in FIG. 13. The degree of the deinterleaver is arbitrary, but it should be large enough to spread error bursts over several blocks of length N. The corresponding interleaver is added before the convolutional encoder.

To find a List-SOVA that operates on terminated data sequences of length N (blockwise data transmission), a first technique is developed called the "$2^k$-method." In this technique, each generated list element on the list L reflects the specific error patterns of the SOVA output in blockwise or interleaved-continuous data transmission. The "$2^k$-method" comprises the following steps:

Step 1:
The following parameters are defined:
the minimum amplitudes $\alpha_k$, where $1 \leq k \leq L$.
the elements of the binary bit flipping array $z_k(L^*)$, where $z_k \in \{0,1\}$ and $0 \leq L^* \leq L-1$.

Step 2:
The input sequence $\hat{y}$ to list generating unit 82 in FIG. 13 is of length N, where each element consists of the reliability value (amplitude) $\hat{L}_j=|\hat{y}_j|$ and a sign value $\hat{x}_j=\text{sign}(\hat{y}_j)$ that characterizes the value of the decoded information bit, where $1 \leq j \leq N$. The amplitudes $\hat{L}_j$ are conveniently ordered and with them their corresponding information bit values $\hat{x}_j$ from the lowest value to the L lowest value as follows:

$$\alpha_1 = \min_{N} (\hat{L}_j)$$

$$\alpha_2 = \min_{N-1} (\hat{L}_j \neq \alpha_1)$$

$$\alpha_3 = \min_{N-2} (\hat{L}_j \neq (\alpha_1, \alpha_2))$$

$$\cdot$$
$$\cdot$$
$$\cdot$$

$$\alpha_k = \min_{N-k+1} (\hat{L}_j \neq (\alpha_1, \ldots, \alpha_{k-1})).$$

Step 3:
The "binary bit flipping" scheme ($2^k$-method) is defined and shown in Table 1 for a list of size 8. Here, the notation $L^*=0$ for the first list element and $L^*=7$ for the $8^{th}$ list element is used because in this notation the integer value of $L^*$ corresponds directly to the binary bit flipping scheme $z(L^*)$. In the scheme an element $z_k(L^*)=1$ implies that the bit with the k lowest amplitude has to be "flipped" to generate list element $L^*$. In other words, list element $L^*$ is generated by changing the information bit value $\hat{x}_j$ from $+1 \rightarrow -1$ or $-1 \rightarrow +1$ (bit flipping) that corresponds to the k lowest amplitude $\alpha_k = \min_{N-k+1}(\hat{L}_{j\neq(\alpha 1)}, \ldots, \alpha_{k-1}))$ where $z_k(L^*)=1$. As an example, list element $L^*=5$ in Table 1 is generated by flipping the information bits with the lowest amplitude $\alpha_1$ and the third lowest amplitude $\alpha_3$, because $z(5)$ has at position 1 and 3 the value 1.

TABLE 1

The $2^k$-method

| $L^*$ | $z_k(L^*)$ | $\alpha_L$, $z_L$, | . . . , . . . | $\alpha_3$, $z_3$ | $\alpha_2$, $z_2$ | $\alpha_1$ $z_1$ |
|---|---|---|---|---|---|---|
| 0 | z(0) | 0, | . . . | 0, | 0, | 0 |
| 1 | z(1) | 0, | . . . | 0, | 0, | 1 |
| 2 | z(2) | 0, | . . . | 0, | 1, | 0 |
| 3 | z(3) | 0, | . . . | 0, | 1, | 1 |
| 4 | z(4) | 0, | . . . | 1, | 0, | 0 |
| 5 | z(5) | 0, | . . . | 1, | 0, | 1 |
| 6 | z(6) | 0, | . . . | 1, | 1, | 0 |
| 7 | z(7) | 0, | . . . | 1, | 1, | 1 |

Step 4:

Note that the "$2^k$-method" (binary bit flipping scheme) has the advantage that the integer value of each list element $L^*$ reflects directly the amplitude values of the erroneous bits in the output sequence of the length N. As an example, if list element $L^*=5$ is successful, we know that the bits with lowest ($\alpha_1$) and the third lowest ($\alpha_3$) amplitudes identify the two bit errors in the output.

The SOVA output after deinterleaving consists mainly, in case of error events, of single or double errors in a block of length N. These errors have, especially for higher signal-to-noise ratios (SNRs), lower amplitudes than the other information bits in that block. A second illustrative technique for constructing a low complexity list generating unit, called a "1 State GVA", that uses this knowledge to generate a list of size L is now defined:

Step 1:

According to steps 1 and 2 of the "$2^k$-method", the L lowest reliability values $\hat{L}$ in each block are identified and rank ordered. Assume that the minimum amplitudes $\alpha_k$, where $1 \leq k \leq L$, contain the L smallest reliability values of the block with length N. Here, the index 1 ($\alpha_1$) corresponds to the lowest amplitude and the index L denotes the $L^{th}$ lowest amplitude.

Figure 14:
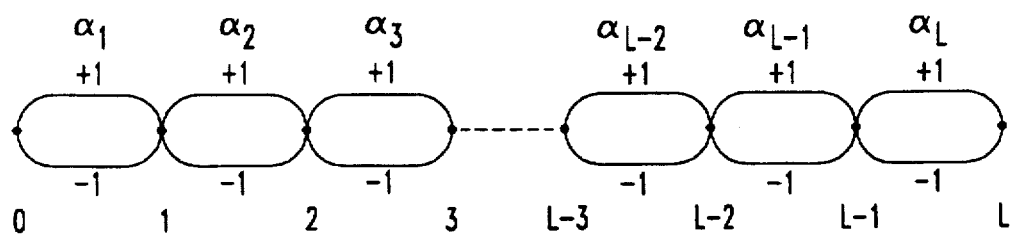
FIG. 14 illustrates a "1 State GVA."

Step 2:

These minimum amplitudes $\alpha_k$ are attached to a one state trellis, as shown in FIG. 14. Then the SGVA, described previously, may advantageously be used to compute the L best paths of the "received" data sequence. The metric increments $\lambda(s_i)$ are the minimum amplitudes $\alpha_k$ (k equal i). An upper branch in the trellis corresponds to a "+1" that implies no bit flipping, and in the lower branches the transmission of "−1" implies bit flipping. Note that the value of the minimum amplitudes $\alpha_k$ are always positive, $\alpha_k \in R^+$. The L best paths of the "received" sequence contain the bit flipping scheme as follows: A "−1" at position k in the $l^{th}$ best path sequence denotes that the k lowest amplitude has to be flipped to generate list element l. Note that after the fourth list element, the bit flipping scheme differs from the "$2^k$-method" and the $l^{th}$ best path is selected as the candidate path with the best metric. Thus, the "1 State GVA" technique can be described as finding the L best maximum cumulative metrics for a block of length N:

$$\Gamma_1 = \sum_{j=1}^{N} \hat{L}_j$$

$$\Gamma_2 = \sum_{j=1}^{N} \hat{L}_j - 2 \cdot \alpha_1$$

$$\Gamma_3 = \sum_{j=1}^{N} \hat{L}_j - 2 \cdot \alpha_2$$

$$\Gamma_4 = \sum_{j=1}^{N} \hat{L}_j - 2 \cdot \alpha_3 \text{ or } \Gamma_4 = \sum_{j=1}^{N} \hat{L}_j - 2(\alpha_1 + \alpha_2)$$

.
:

Here, the indices of the cumulative metrics denote the number of list element considered.

The technique is thus conveniently used to generate a list of length L out of the deinterleaved SOVA output. This method has a low complexity because only for the L minimum amplitudes only need be found for the L best paths. The lists are with the notation L that characterizes the number of list elements that are considered. The SOVA and the interleaver effectively "remove the code." The "1 State-GVA" is a list output GVA on uncoded data.

The methods and algorithms have been described without reference to specific hardware or software. Instead, the individual steps have been described in such a manner that those skilled in the art can readily adapt such hardware and software as may be available or preferable for particular applications.

While the above description has used decoding of convolutional codes as an example of the potential applications of the SGVA, List-SOVA, and Soft-GVA as described in the present invention, it should be emphasized that the techniques have application beyond convolutional codes to those applications which use a trellis structure to describe the states of processing at each of the relevant times during decoding. Likewise, binary codes described above should not be viewed as limiting the range of application of the presently disclosed inventive teachings. Those skilled in the art will find application of the present invention in a variety of contexts.

We claim:

1. A method of processing a sequence of signals, said method comprising the steps of:

receiving said signals over a communications channel corrupted by noise, determining a set of L best candidate sequences of signals, wherein each candidate sequence l, $1 \leq l \leq L$, in said set of best candidate sequences represents a sequence of length N, wherein candidate sequence l, $1 \leq l \leq L$, in said set of L best candidate sequences corresponds to a path through a trellis structure having N stages and a plurality of states at each stage, wherein the (l+1) th best candidate sequence is derived from knowledge of the first l best candidate sequences, wherein the l=1 best path through said trellis is known, wherein each path entering each state at each stage has a cumulative metric associated with it, wherein each path entering each state at each stage has a metric increment associated with a transition to another state at a next stage, wherein the state at each stage for each path is known, wherein l' is the number of the path with which the $(l+1)^{th}$ best path re-merges, wherein the stage where the $(l+1)^{th}$ best path re-merges with path l' is a re-merging point, and wherein initially the re-merging point is set equal to the $N^{th}$ stage of said trellis and wherein l=l'=1, and further comprising the steps of:
a. calculating and storing along the $l^{th}$ best path a plurality of absolute differences, said absolute differences representing at each stage the magnitude of the difference of the cumulative metrics of the paths merging at said stage;
b. excluding all re-merging points;
c. finding the minimum absolute difference along the $l^{th}$ best path and storing the position of said minimum absolute difference;
d. computing and storing the cumulative metric at the last state of the next best candidate to path l which goes through said re-merging point;
e. repeating steps (b) through (d) if candidate l exists on the list of proposed candidates for the $(l+1)^{th}$ best path;
f. repeating steps (b) through (d) for path l' if $l \geq 2$;
g. selecting as the $(l+1)^{th}$ best candidate the one of l candidate paths with the best cumulative metric at the final state; storing as l' the path with which the $(l+1)^{th}$ best path re-merges and storing the re-merging point;
h. incrementing l by one;
i. repeating steps (a)-(h) until l=L.

2. The method of claim 1 wherein said sequence has been coded by a convolutional code.

3. The method of claim 2 wherein said convolutional coder is an inner decoder in a concatenated coding scheme.

4. The method of claim 1 wherein said l=1 best path, said cumulative metrics, and said incremental metrics are calculated using a Viterbi algorithm.

5. The method of claim 1 wherein said sequence is a maximum free distance binary convolutional encoded sequence.

6. The method of claim 5 wherein said metric increments are calculated using a symmetry line, $s_{sym}$, at state $s_{sym}=S/2$ where S is the total number of states in the trellis, such that only metric increments $\lambda]\epsilon_i=(i+1,i)]$ for states $s_{i+1}<s_{sym}$ need be computed, and for states $s_{i+1} \geq s_{sym}$, the metric increments are inverted so that $\lambda(s_{i+1},s_i)=-\lambda(s_{i+1}-s_{sym},s_i)$.

7. The method of claim 5 wherein the cumulative metrics are computed using the rule $\Gamma(s_{i+1},s_i)=\Gamma(s_i)+(-1)^{s_i} \cdot \lambda(s_{i+1})$.

8. The method of claim 1 wherein said absolute differences are calculated by a soft symbol output Viterbi algorithm.

9. A method of processing a first sequence of signals to determine a reliability measure for each symbol in a second sequence of signals, said first sequence of signals having been received over a communications channel corrupted by noise wherein a set of L best estimates of said second sequence are known, wherein each element l, $1 \leq l \leq L$, in said set of L best estimates corresponds to an $l^{th}$ best path through a binary trellis structure having a plurality of stages and a plurality of states at each stage, wherein each of the l, $1 \leq l \leq L$, best paths has a cumulative metric associated with it, said method comprising the steps of:

initializing the $i^{th}$ element of a reliability vector with a first difference value, said first difference value equal to the difference between the cumulative metrics of paths merging at state i;

shifting the elements in said reliability vector to the left by a specified number of elements, v, and substituting for the specified number of right most elements a constant high value;

calculating for each path l, $2 \leq l \leq L$, a second difference value, said second difference value equal to the difference between the cumulative metric for said path and the cumulative metric of the best path;

comparing for each path the bit sequence of the $l^{th}$ best path, $2 \leq l \leq L$ to the bit sequence of the best path and marking the positions where the paths differ;

storing in the positions in said reliability vector where said paths differ, the smaller of said first difference or said second difference.

10. The method of claim 9 wherein said first sequence is encoded using a convolutional code and wherein v equals the memory of said convolutional code.

11. A method of processing a first sequence of signals, said first sequence of signals having been received over a communications channel corrupted by noise, to determine a reliability measure for each symbol in a second sequence of signals, wherein a set of L best estimates of said second sequence are known, wherein each element l, $1 \leq l \leq L$, in said set of L best estimates corresponds to an $l^{th}$ best path through a trellis structure having a plurality of stages and a plurality of states at each stage, wherein each of the l, $1 \leq l \leq L$, best paths has a cumulative metric associated with it, said method comprising the steps of:

initializing a reliability vector with a first constant value, wherein said reliability vector is of length equal to the number of symbols in said second sequence;

selecting for each $2 \leq l \leq L$ best path a respective second value;

comparing the symbol sequence of the $l^{th}$ best path $2 \leq l \leq L$ to the symbol sequence of the l=1 best path and determining the positions where said symbol sequences differ;

storing, in those positions where the l=1 best path and the $l^{th}$ path $2 \leq l \leq L$ differ, the higher of the difference or of the value in said positions in said reliability vector.

12. The method of claim 11 wherein said respective second value is selected as difference between the cumulative metric for the $l^{th}$, $2 \leq l \leq L$, best path and the cumulative metric for the best path.

13. The method of claim 12 wherein said first constant value is equal to one and wherein said second value is further divided by the value of the cumulative metric of the best path.

14. The method of claim 11 wherein said second value is selected as equal to the cumulative metric of the $L^{th}$ best path plus a constant, wherein said constant is a positive real number and wherein said constant is dependent on the signal to noise ratio of said first sequence.

15. A method of processing a coded information sequence of signals, said method comprising the steps of:

decoding said information sequence to yield a set of N decoded information symbols wherein each decoded information symbol in said set of decoded information symbols has a corresponding reliability value in a set of reliability values;

ordering, from lowest to highest, the amplitudes of said reliability values to form an ordered set of reliability values;

associating the first l, $l \leq N$, of said reliability values in said ordered set of reliability values with a one-state trellis structure, wherein said one-state trellis structure has l stages, and
wherein said associating is according to the rule that the $i^{th}$ reliability value in said ordered set of reliability values is associated with the $i^{th}$ stage of said one-state trellis structure, $1 \leq i \leq l$;

determining a set of l best candidates for the decoded information sequence,
wherein each of said candidates corresponds to a path through said one-state trellis structure,
wherein each path through said one-state trellis structure has a cumulative metric associated with it, and
wherein the set of l best candidates are, respectively, those paths with the l best cumulative metrics.

16. A method of processing an information signal, wherein said information signal comprises a sequence of values, said method comprising the steps of:

determining an $l+1^{th}$ best candidate sequence of values representing said information signal based on a signal representing a set of first l best candidate sequences of values,
wherein each of said candidate sequences of values corresponds to a path through a trellis structure, said trellis structure having a plurality of stages and a plurality of states at each stage, and wherein each state at each stage corresponds to a value in a candidate sequence of values and wherein each state has metric associated wherein said metric is a reliability measure corresponding to said value;
said determining further comprising finding the state with the minimum metric along each path through said trellis structure, and identifying as the $l+1^{th}$ best candidate path the path which merges with the one of the l best paths at the state with the smallest minimum metric among the l best paths.

17. The method of claim 16 wherein the l=1 best candidate sequence of values is generated by a soft output Viterbi algorithm.

18. The method of claim 16 wherein said metrics along the $l+1^{th}$ best path are initialized with the metrics of the path with which said $l+1^{th}$ best merged at said state with said smallest minimum metric.

19. The method of claim 16 further comprising the step of replacing said smallest minimum metric with a high value.

20. A method for determining a reliability value for each element in a sequence included in an information signal, each of said reliability values being stored in a reliability vector, the method comprising the steps of:

receiving a signal representing a set of L best candidate sequences representing said sequence included in said information signal, said signal having been received over a communications channel corrupted by noise;

receiving a signal representing a metric for each candidate sequence in said set of L best candidate sequences, wherein said metric is indicative of the relative similarity of each candidate sequence in said set of L best candidate sequences to said sequence;

initializing said reliability vector with initial values; and storing, in said reliability vector in those positions where corresponding elements of said best candidate sequence and of the $l^{th}$ (l>1) best candidate sequence differ, the higher of said initial value in said reliability vector or a difference value.

21. The method of claim 20 wherein said signal representing said set of L best candidate sequences is generated by a generalized Viterbi algorithm.

22. The method of claim 20 wherein said difference value is a function of the metric for the $l^{th}$ best candidate sequence (l>1) and of the metric of the best candidate sequence.

23. The method of claim 20 wherein said initial values are soft initialization values.

24. A method for processing an information signal, said signal having been received over a communications channel corrupted by noise, wherein said information signal comprises a sequence of values, said method comprising the steps of:

determining a set of L (>1) best candidate sequences representing said information signal based on a signal containing a best candidate sequence and reliability values for individual bits in said best candidate sequence;

said determining further comprising:
ordering, from lowest to highest, said reliability values to form an ordered set;
associating elements in said ordered set as metrics for successive stages with a one state trellis;
finding a set of successive best paths through said one state trellis, wherein each of said paths corresponds to a candidate sequence for said sequence of values, wherein the quality of said best path is the sum of said metrics, and
wherein the relative quality of each successive best paths in said set of successive best paths is measured by subtracting from said sum of said metrics for said best path twice the metric corresponding to the stages in which each of said successive best paths and said best path through said trellis differ.

25. The method of claim 24 wherein said signal is generated by a soft output Viterbi algorithm.

* * * * *